United States Patent
Fulford, Jr. et al.

[19]

[11] Patent Number: 5,874,343
[45] Date of Patent: *Feb. 23, 1999

[54] CMOS INTEGRATED CIRCUIT AND METHOD FOR FORMING SOURCE/DRAIN AREAS PRIOR TO FORMING LIGHTLY DOPED DRAINS TO OPTIMIZE THE THERMAL DIFFUSIVITY THEREOF

[75] Inventors: H. Jim Fulford, Jr., Austin; Mark I. Gardner, Cedar Creek; Derick J. Wristers, Austin, all of Tex.

[73] Assignee: Advanced Micro Devices, Inc.

[ * ] Notice: This patent issued on a continued prosecution application filed under 37 CFR 1.53(d), and is subject to the twenty year patent term provisions of 35 U.S.C. 154(a)(2).

[21] Appl. No.: 760,464

[22] Filed: Dec. 6, 1996

[51] Int. Cl.⁶ .................................................. H01L 21/70
[52] U.S. Cl. ......................... 438/305; 257/336; 438/231
[58] Field of Search ................................... 257/336, 338, 257/344; 438/305

[56] References Cited

U.S. PATENT DOCUMENTS

| | | | |
|---|---|---|---|
| 5,434,440 | 7/1995 | Yoshitomi et al. | 257/344 |
| 5,491,099 | 2/1996 | Hsu | 437/35 |
| 5,498,556 | 3/1996 | Hong et al. | 437/35 |

Primary Examiner—Olik Chaudhuri
Assistant Examiner—Douglas A. Wille
Attorney, Agent, or Firm—Kevin L. Daffer; Conley, Rose & Tayon

[57] ABSTRACT

A transistor and a transistor fabrication method in which the heavy source/drain implants which require high-temperature thermal anneals are performed before the LDD implants which require lower temperature thermal anneals. In addition, the n-type arsenic source/drain implant which requires the highest temperature anneal is performed prior to the p-type boron implant which requires a lower temperature thermal anneal. In a conventional LDD, the LDD implants are performed first, prior to the source/drain implants. The LDD implants, especially the p-type boron implants, are annealed at a relatively low temperature. The source/drain implants require a higher thermal anneal temperature since they need to diffuse a longer distance. The n-type arsenic source/drain implants require an especially high temperature since arsenic is relatively large ion with a low diffusivity. During the high temperature thermal anneal, the LDD implants that are already present will migrate significantly. Lateral migration towards the channel will shorten the channel length and cause short-channel effects, and vertical migration into the substrate will cause an increase of the parasitic capacitance. The current invention reverses the formation process to avoid such problems. The n-type arsenic source/drain implant is performed first, and the p-type LDD implant is performed last.

9 Claims, 5 Drawing Sheets

CMOS INTEGRATED CIRCUIT AND METHOD FOR FORMING SOURCE/DRAIN AREAS PRIOR TO FORMING LIGHTLY DOPED DRAINS TO OPTIMIZE THE THERMAL DIFFUSIVITY THEREOF

BACKGROUND OF THE INVENTION

1. Field of the Invention

This invention relates to semiconductor processing and, more particularly, to a method of forming a lightly doped drain structure in which the heavy concentration source/drain implant areas are formed before the lighter concentration LDD implant areas.

2. Description of Relevant Art

Fabrication of a metal-oxide-semiconductor ("MOS") transistor is well-known. Fabrication begins by lightly doping a single crystal silicon substrate n-type or p-type. The specific area where the transistor will be formed is then isolated from other areas on the substrate with the use of isolation structures. In modern fabrication technologies, the isolation structures may comprise shallow trenches in the substrate filled with dielectric oxide which acts as an insulator. Isolation structures may alternatively comprise, for example, locally oxidized silicon ("LOCOS") structures well known in the art. A gate dielectric may be formed by oxidizing the silicon substrate. Oxidation is generally performed in a thermal oxidation furnace or, alternatively, in a rapid thermal anneal ("RTA") apparatus. A gate conductor is then patterned from a layer of polycrystalline silicon ("polysilicon") deposited on the gate dielectric. The polysilicon is rendered conductive by doping it with ions from an implanter or a diffusion furnace. The gate conductor is patterned using a mask followed by exposure, development, and etching. Subsequently, source and drain regions are doped, via ion implantation, with a high dosage n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When voltage above a certain threshold is applied to the gate of an enhancement-mode transistor, the channel between the source and drain becomes conductive and the transistor turns on.

NMOS remained the dominant MOS technology as long as the integration level of devices on a chip was sufficiently low. It is somewhat inexpensive to fabricate, functionally dense, and faster than PMOS. NMOS logic gates (i.e., inverters) draw DC power during one of the inverter states. Therefore, an NMOS integrated circuit will draw a steady current even when being operated in the standby mode (i.e., even when no signal is being propagated through the circuit). During the modern VLSI era, power consumption in NMOS circuits began to exceed tolerable limits. A lower power technology was needed to exploit the VLSI techniques. Complimentary MOS ("CMOS") represented such a technology. CMOS is called so because it uses a combination of an NMOS transistor with a PMOS transistor. Therefore, in a CMOS inverter (unlike in in NMOS inverter) only one of the two transistors is driven at any one time. This means that when a CMOS inverter is not switching from one state to the other, a high impedance path exists from the supply voltage to ground, regardless of the state the inverter is in. Hence, virtually no current flows, and almost no DC power is dissipated. CMOS thus allows the manufacture of circuits with standby power on the order of microwatts.

As device dimensions are reduced while supply voltages remain constant (or are not reduced as rapidly as the structures are scaled), the maximum electric field $E_m$ becomes more isolated near the drain side of the channel causing accelerated inversion-layer charges (or carriers) to enter into the overlying gate oxide. The carriers become trapped in the gate dielectric, a phenomenon generally called the hot-carrier effect. The injection of hot carriers into the gate dielectric damages the substrate/gate dielectric interface. Over time, operational characteristics of the device may degrade due to this damage, that degradation resulting in, e.g., improper variation of threshold voltage, linear region transconductance, subthreshold slope, and saturation current. This may eventually reduce the lifetime of the devices. As a result, several techniques have been developed to combat hot-carrier injection problems.

One set of methods involves making the gate dielectric and/or the gate substrate/dielectric interface more resistant to hot carriers. This may be accomplished by developing dielectric films that exhibit fewer oxide trapping centers and interface state traps. Reducing charge trapping opportunities, however, has given way to simply reducing $E_m$. Reducing $E_m$ in the drain-side of the channel is a popular way to control the hot-carrier effect. A common approach to reducing $E_m$ is to minimize the abruptness in voltage chances near the drain side of the channel. Disbursing abrupt voltage changes reduces $E_m$ strength and the harmful hot-carrier effects resulting therefrom.

Reducing $E_m$ occurs by replacing an abrupt drain doping profile with a more gradually varying doping profile. A more gradual doping profile distributes $E_m$ alone a larger lateral distance so that the voltage drop is shared by the channel and the drain. Absent a gradual doping profile, an abrupt junction can exist where almost all of the voltage drop occurs across the lightly-doped channel.

The simplest method to obtain a gradual doping at the drain-side channel is to use a dopant with a high diffusivity, for example, phosphorus instead of arsenic for an n-channel device. The faster-diffusing phosphorus readily migrates from its implant position in the drain toward the channel creating a gradually doped drain and consequently a smoother voltage profile. Unfortunately, however, the high diffusivity of phosphorus, in addition to creating a gradual lateral doping profile, also increases the lateral and vertical extents of the source and drain. Enlarging the source/drain junctions may bring about harmful short-channel effects and/or parasitic capacitances. Short-channel effects may result in less well-predicted threshold voltage, larger sub-threshold currents, and altered I-V characteristics.

The most widely-used device structure for achieving a doping gradient at the drain-side of channel is the lightly-doped drain ("LDD"). An LDD structure is made by a two-step implant process. The first step takes place after the formation of the gate. For an n-channel device, a relatively light implant of phosphorus is used to form the lightly doped region adjacent the channel (i.e., the LDD implant). The LDD implants are also referred to as N⁻ and P⁻ implants because of their lower concentrations. A conformnal CVD oxide film is then deposited over the LDD implant and interposed gate. The oxide is partially removed using an anisotropic dry-etch process. Anisotropic etch removes oxide in the substantially horizontal regions, leaving what are known as "spacers" on the sides of the gate. After the oxide spacers are formed, a second implant takes place at a higher dosage than the first implant. The second implant is chosen to use the same implant "type" (i.e., n or p) as the first. The higher concentration source/drain implant are also referred to as N+ and P+ implants. The source/drain implant is masked from areas adjacent the gate by virtue of the pre-existing spacers. Using an n-type example, the first implant may use phosphorus, while the second uses arsenic. The spacers serve to mask the arsenic and to offset it from the gate edges. By introducing spacers after the LDD implant, the LDD structure offers a great deal of flexibility in doping the LDD area relative to the source/drain area. The LDD area is controlled by the lateral spacer dimension and the thermal drive cycle, and is made independent from the source and drain implant (second implant) depth. The conventional LDD process, however, sacrifices some device performance to improve hot-carrier resistance. For example, the LDD process exhibits reduced drive current under comparable gate and source voltages.

A thermal anneal step is required after ion implantation in order to diffuse and activate the implanted ions and repair possible implant damage to the crystal structure. An anneal can occur in a furnace or the more modern rapid thermal anneal ("RTA") chamber. An RTA process is typically performed at 420°–1150° C. and lasts anywhere from a few seconds to a few minutes. Large area incoherent energy sources were developed to ensure uniform heating of the wafers and to avoid warpage. These sources emit radiant light which allows very rapid and uniform heating and cooling. Wafers are thermally isolated so that radiant (not conductive) heating and cooling is dominant. Various heat sources are utilized, including arc lamps, tungsten-halogen lamps, and resistively-heated slotted graphite sheets. Most heating is performed in inert atmospheres (argon or nitro-en) or vacuum, although oxygen or ammonia for growth of silicon dioxide and silicon nitride may be introduced into the RTA chamber.

The temperature and time required for an RTA are tailored to the implant type and to the reasons for the implant. Dopants with a high diffusivity require higher anneal temperatures to activate and position the dopants. Dopants with a low diffusivity require lower anneal temperatures. In addition, higher concentrations of the dopants require higher anneal temperatures. Furthermore, the dopants used for the LDD implants require lower temperature anneals since any additional migration of these dopants is especially harmful. Any migration towards the channel will contribute to short-channel effects and any vertical migration will increase the parasitic capacitance. In a conventional LDD, the LDD implants are performed first and any subsequent thermal anneal to activate and diffuse the subsequent source/drain implants will also thermally affect the LDD implants.

SUMMARY OF THE INVENTION

The problems outlined above are in large part solved by a transistor and a transistor fabrication method in which the heavy concentration source/drain implants which require high-temperature thermal anneals are performed before lighter concentration LDD implants which require lower temperature thermal anneals. In a CMOS design, the n-type arsenic source/drain implant which requires the highest temperature anneal is performed prior to the p-type boron source/drain implant which requires a lower temperature thermal anneal.

In a conventional LDD, the LDD implants are performed first, prior to the source/drain implants. The LDD implants, especially the p-type boron implants, are annealed at a relatively low temperature. The source/drain implants require a higher thermal anneal temperature since the implant species are larger and often need to diffuse a longer distance. The n-type arsenic source/drain implants require an especially high temperature due to its relatively large atomic mass and commensurate low diffusion. During the high temperature thermal anneal, the LDD implants that are already present will migrate significantly. Lateral migration towards the channel will shorten the channel length and cause short-channel effects, and vertical migration into the substrate will cause an increase of the parasitic capacitance. The current invention reverses the formation process to avoid such problems. The n-type arsenic source/drain implant is performned first, and the p-type LDD implant is performed last.

The present process implants species with the lowest diffusivity first. A relatively high anneal temperature is then applied to the low diffusivity implant without affecting any pre-existing, lower diffusivity implants. In most instances, the lowest diffusivity implant is the N+ source/drain implant. After the n-type source/drain is annealed, the next lowest diffusivity implant is applied, possibly also followed by anneal which is of lower temperature than the post N+ source/drain anneal. Source/drain and LDD implants are applied in proper sequence, each of which can be followed by an optional anneal to achieve a CMOS device. The CMOS device implants are formned in proper sequence with separate optional post-implant anneals to ensure low diffusivity species are properly activated and high diffusivity species do not jeopardize channel integrity. The overall structure is a graded junction at the drain side of the channel for the purpose of hot-carrier suppression.

A first and second gate conductors are first formed upon respective first and second channel areas of a semiconductor topography. First and second gate conductors are displaced a certain lateral distance apart and are electrically isolated from each other with a shallow trench structure. First and second gate conductors are patterned from a deposited layer of polysilicon. Subsequently, a dielectric layer is deposited upon the semiconductor topography and then partially removed to form spacers upon opposed surfaces of both the first and second gate conductors. N-type species, preferably comprising arsenic, of a first concentration are then introduced into the semiconductor topography a spaced distance from only the first channel area. The semiconductor topography is annealed at a first temperature, using either a furnace or an RTA, in order to activate and position the arsenic ions within the first pair of source/drain areas of the semiconductor substrate. P-type species, preferably comprising boron, of a second concentration are then introduced into the semiconductor topography a spaced distance from only the second channel area. The implanted p-type species form a second pair of source/drain areas.

After the source/drain areas are in place, the spacers are removed from the opposed sidewall surfaces of the first and second gate conductors. N-type species, preferably comprising phosphorus, of a third concentration are implanted into the semiconductor topography substantially adjacent only the first channel area. Third n-type concentration is less than the first n-type concentration. P-type species, preferably comprising boron, of a fourth concentration are implanted into the semiconductor topography substantially adjacent only the second channel area. Fourth p-type concentration is less than second p-type concentration. The semiconductor topography is thermally annealed at a second temperature which is less than the first temperature. Optional thermal anneals may be performed at a third temperature after implanting the second concentration of a p-type species, and at a fourth temperature after implanting the third concentration of an n-type species. The third temperature is less than the first temperature and greater than the second temperature, and the fourth temperature is less than the second temperature and greater than the second temperature.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
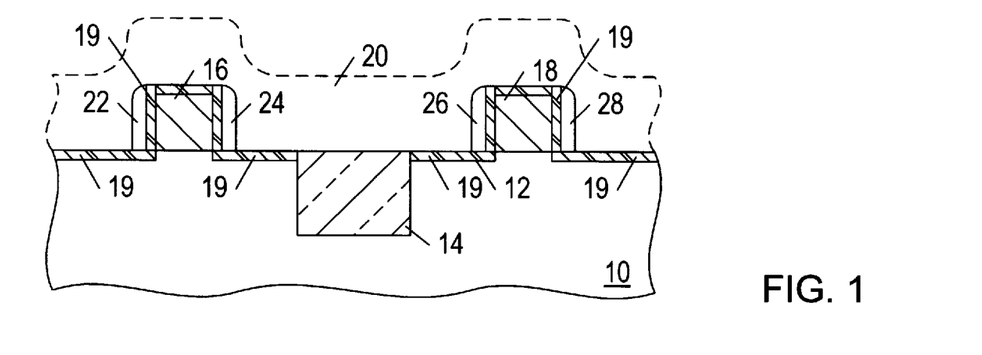
FIG. 1 is a partial cross-sectional view of a semiconductor topography showing two gate conductors formed a certain lateral distance apart with spacers formed on dielectric-covered sidewall surfaces of the gate conductors.

Turning now to the drawings, FIG. 1 is a partial cross-sectional view of semiconductor substrate 10 with an upper surface 12. Semiconductor substrate 10 preferably comprises lightly doped n-type or p-type single-crystalline silicon having a resistivity suitably in the range near 12 Ω-cm. Isolation structure 14 is then formned in the field region of semiconductor substrate 10. Isolation structure 14 is shown here as a shallow trench filled with a dielectric material, but it may alternatively comprise a LOCOS type isolation structure. Subsequently, a polysilicon layer is deposited a dielectric distance above upper surface 12 of semiconductor substrate 10 and then patterned to form first gate conductor 16 and second gate conductor 18 a spaced distance from opposing sides of isolation structure 14. Conformal dielectric layer 20 is then deposited upon the semiconductor topography. In a preferred embodiment, conformal dielectric layer 20 comprises decomposed TEOS deposited by a chemical vapor deposition ("CVD") process. This produces a film with excellent conformality. An anisotropic etch is then applied to remove dielectric at a faster rate along the horizontal surfaces than the vertical surfaces. The anisotrople etch removes the oxide in the substantially horizontal regions while leaving spacers on the sidewall surfaces of gate conductors 16 and 18. Oxide spacers 22 and 24 are formed on the sidewalls of gate conductor 16, and oxide spacers 26 and 28 are formed on the sidewalls of gate conductor 18. In an alternative embodiment, dielectric spacers 22, 24, 26, and 28 may comprise nitride or polysilicon patterned from a CVD nitride or polysilicon layer. In an embodiment where the dielectric spacers comprise nitride or polysilicon, etch stop layer 19 is first formed upon upper surface 12 of semiconductor substrate 10 and upon gate conductors 16 and 18. Etch stop layer 19 is preferably formed by thermal oxidation. Thus, etch stop layer 19 comprises oxide formed upon and within poly-crystalline and single-crystalline silicon. Etch stop layer 19 ensures etch selectivity between the subsequently formed spacers and the etch stop layer during removal of the spacers at a later stage of the present process set forth below. Etch stop layer 19 is omitted from subsequent figures for the sake of brevity. However, it is understood that layer 19 is nonetheless present, especially if the spacers are formed from nitride or polysilicon.

Figure 2:
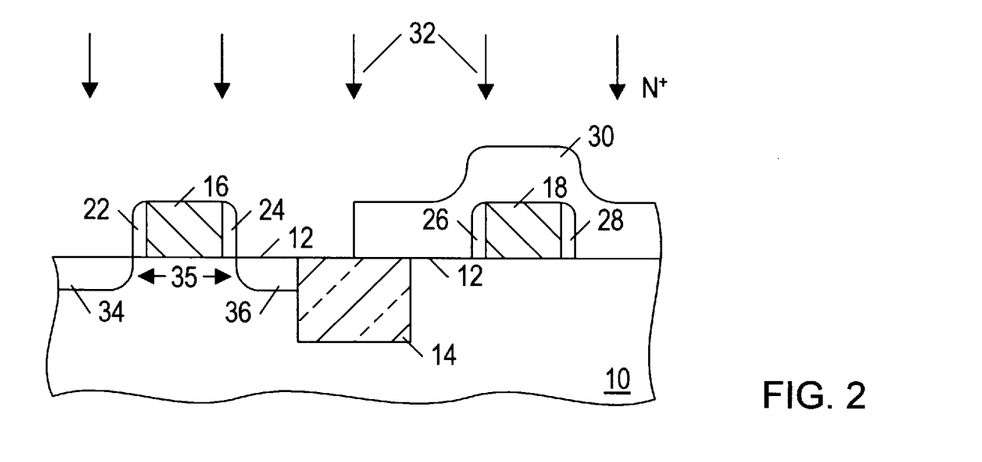
FIG. 2 is a partial cross-sectional view of a semiconductor topography according to a processing step subsequent to FIG. 1 in which a first concentration of an n-type species (N+ source/drain) is implanted into the semiconductor topography a spaced distance only from the first channel area.

Turning now to FIG. 2, a step subsequent to FIG. 1 is shown in which photoresist layer 30 is deposited upon the semiconductor topography. Photoresist layer 30 is then patterned in such a way as to expose gate conductor 16 and part of upper surface 12 on opposing sides of gate conductor 16. All portions of the active area of semiconductor substrate 10 where the NMOS type transistors will be formed are now exposed. A first concentration of n-type dopants 32 is then introduced into gate conductor 16 and source/drain regions 34 and 36 a spaced distance from first channel area 35 due to lo masking incurred by spacers 22 and 24. N-type dopants 32 preferably comprise arsenic ions introduced by a high-current implanter at a dose somewhere near $5 \times 10^{15}$ cm$^{-2}$ and at energies of 10–80 keV, for example.

Figure 3:
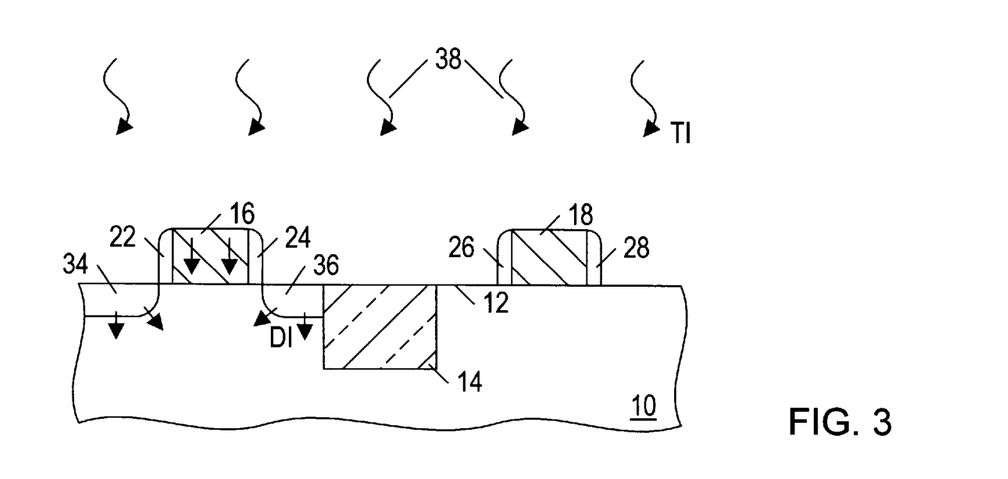
FIG. 3 is a partial cross-sectional view of a semiconductor topography according to a processing step subsequent to FIG. 2 in which a thermal anneal at a first temperature is performed on the semiconductor topography.

Turning now to FIG. 3, a step subsequent to FIG. 2 is shown in which photoresist layer 30 has been removed and the wafer is thermally annealed. In a preferred embodiment, thermal anneal 38 is performned in an RTA chamber. The wafers are preferably annealed for approximately 10–30 seconds at a temperature $T_1$ of approximately 950°–1050° C. In an alternative embodiment, thermal anneal 38 may be performed in a conventional furnace. Thermal anneal 38 is performed to activate gate and source/drain N$^+$ implants and to diffuse them into position. Arsenic is a large ion with a low diffusion constant and, therefore, requires relatively high temperatures to be activated and to migrate to its desired location. In addition, a high temperature thermal anneal is required due to the higher dopant concentration used for the source/drain implant. More energy is needed to diffuse a higher number of ions. Therefore, an advantage hereof is to perform such a high temperature anneal step early in the process cycle, before implanting species with a higher diffusion constant in subsequent processing steps.

Figure 4:
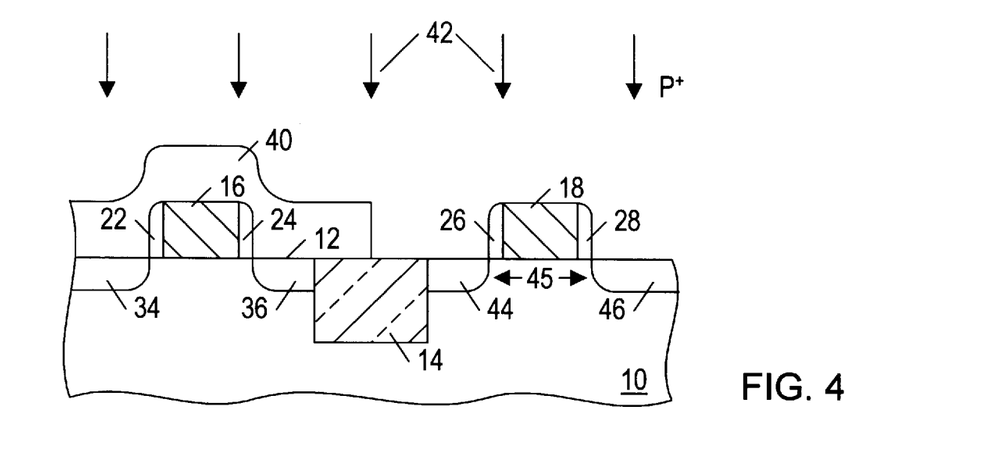
FIG. 4 is a partial cross-sectional view of a semiconductor topography according to a processing step subsequent to FIG. 3 in which a second p-type species (P+ source/drain) is implanted into the semiconductor topography a spaced distance from the second channel area.

Turning now to FIG. 4, a step subsequent to FIG. 3 is shown in which photoresist layer 40 is deposited upon the semiconductor topography. Photoresist layer 40 is then patterned in such a way as to expose gate conductor 18 and part of upper surface 12 on opposing sides of gate conductor 18. Photoresist layer 40 is patterned using a reverse mask to the one used to pattern photoresist layer 30. The previously covered portion of the semiconductor topography is now exposed. This is the portion of the semiconductor topography where the PMOS type transistors will be formed. A second concentration of p-type dopants 42 is then introduced into gate conductor 18 and source/drain regions 44 and 46 a spaced distance from first channel area 45 due to the masking of spacers 26 and 28. P$^+$ dopants 42 preferably comprise boron ions introduced by a high-current implanter at a dose somewhere near $10^{15}$ cm$^{-2}$ and at energies of 10–70 keV, for example.

Figure 5A:
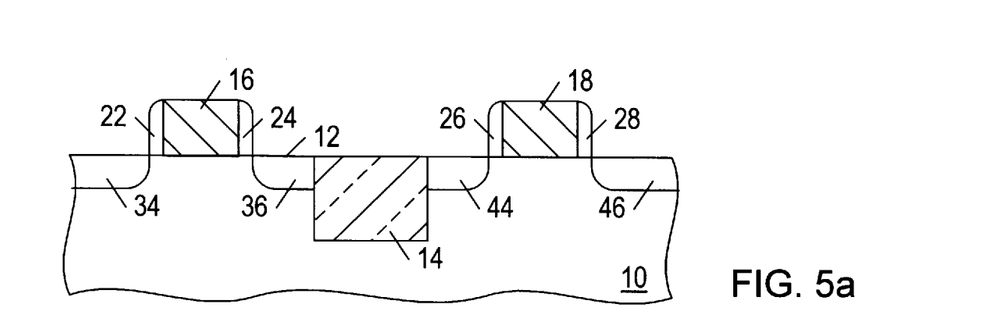
FIG. 5a is a partial cross-sectional view of a semiconductor topography according to a processing step subsequent to FIG. 4 in which the photoresist layer upon the first gate conductor is removed.

Turning now to FIG. 5a, a step subsequent to FIG. 4 is shown in which photoresist layer 40 is entirely removed. Depending on the type of the photoresist, an organic stripper, preferably phenol-free, may be used to remove the photoresist. An inorganic stripper like sulfuric acid with hydrogen peroxide or ammonium persulfate may also be used. FIG. 5a illustrates one embodiment absent of an anneal cycle.

Figure 5B:
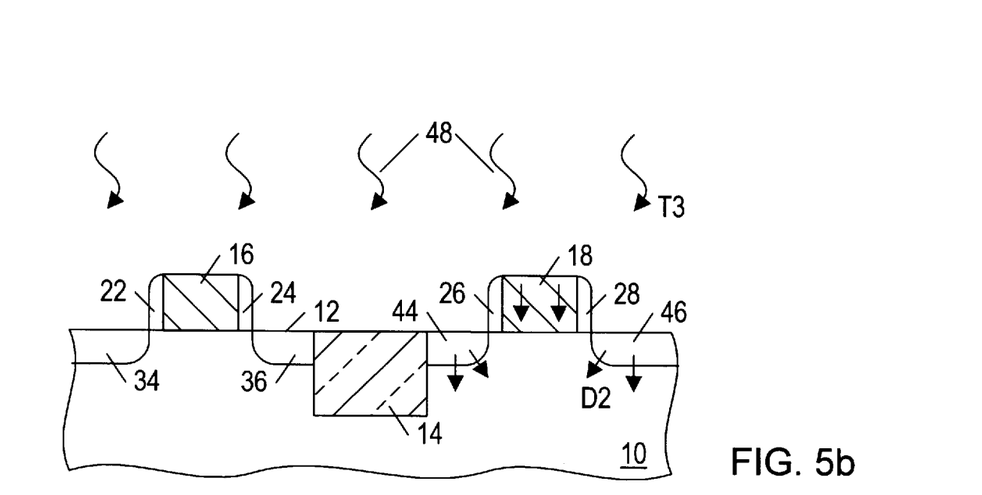
FIG. 5b is a partial cross-sectional view of a semiconductor topography according to a processing step subsequent to FIG. 4 in which the photoresist layer is removed and an optional thermal anneal at a third temperature less than the first temperature is performed.

Turning now to FIG. 5b, a step subsequent to FIG. 4 is shown in which an optional thermal anneal is performed. Thermal anneal 48 may be performed to activate and position the second concentration of P$^+$ ions. The thermal anneal is performed at a third temperature $T_3$ which is less than the first temperature $T_1$. Boron, used as the p-type source/drain implant, is a smaller ion with a higher diffusivity than arsenic, for example, the n-type source/drain implant and thus requires lower temperatures to migrate the same distance. The already implanted and activated arsenic ions are not affected much by the lower temperature thermal anneal because of their much lower diffusivity.

Figure 6:
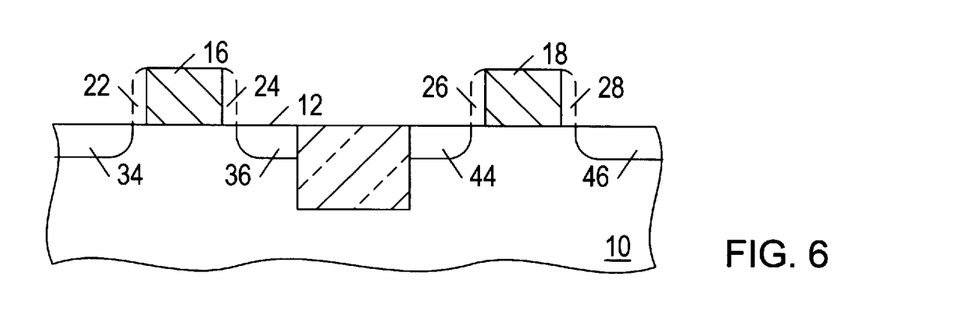
FIG. 6 is a partial cross-sectional view of a semiconductor topography according to a processing step subsequent to FIG. 5a or 5b in which the spacers on the opposed sidewall surfaces of both the first and second gate conductors are removed.

Turning now to FIG. 6, a step subsequent to FIG. 5b is shown in which dielectric spacers 22, 24, 26, and 28 on the opposed sidewall surfaces of first and second gate conductors 16 and 18 are removed. Depending on the dielectric material used to form the spacers, the appropriate selective etch is used to remove them. If the spacers comprise silicon dioxide, hydrofluoric acid is preferably used; if the spacers comprise polysilicon, a combination of nitric acid and hydrofluoric acid is preferably used; and, if the spacers comprise nitride, phosphoric acid is preferably used. Alternatively, spacers can be removed using a plasma (dry) etch. The spacers are removed from the gate conductors of both the NMOS and PMOS type transistors. The spacers are removed to enable n-type and p-type LDD implants substantially adjacent the gate conductors as set forth below.

Figure 7:
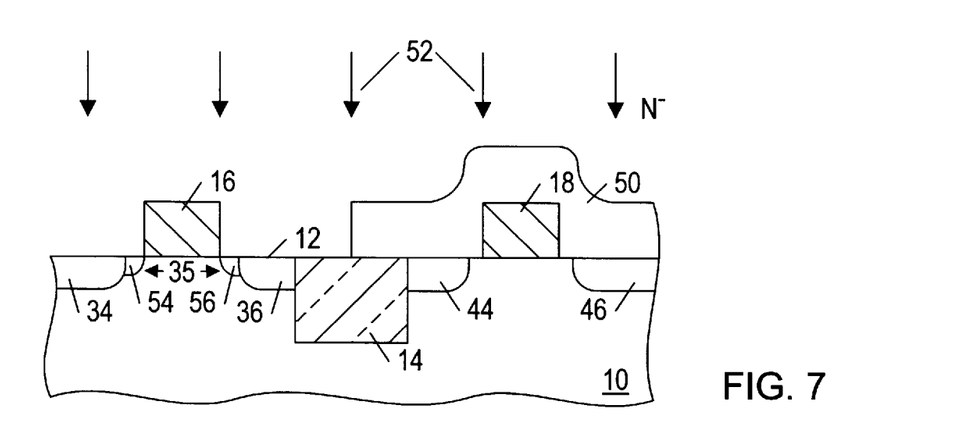
FIG. 7 is a partial cross-sectional view of a semiconductor topography according to a processing step subsequent to FIG. 6 in which a third n-type species (N− LDD) is implanted into the semiconductor topography substantially adjacent the first channel area.

Turning now to FIG. 7, a step subsequent to FIG. 6 is shown in which photoresist layer 50 is deposited upon the semiconductor topography. Photoresist layer 50 is then patterned in such a way as to expose gate conductor 16 and part of upper surface 12 on opposing sides of gate conductor 16. Photoresist layer 50 is patterned using the same mask to pattern photoresist layer 30 and the reverse of the mask used to pattern photoresist layer 50. All portions of the semiconductor topography where NMOS type transistors will be formed are now exposed. A third concentration of n-type dopants 52 is then introduced into gate conductor 16 and LDD areas 54 and 56 substantially adjacent to channel area 35 due to the absence of spacers 22 and 24. N$^-$ dopants 52 preferably comprise phosphorus ions introduced by a low-current implanter at a dose somewhere near $5 \times 10^{12}$–$5 \times 10^{13}$ cm$^{-2}$ and at energies of 10–60 keV, for example.

Figure 8A:
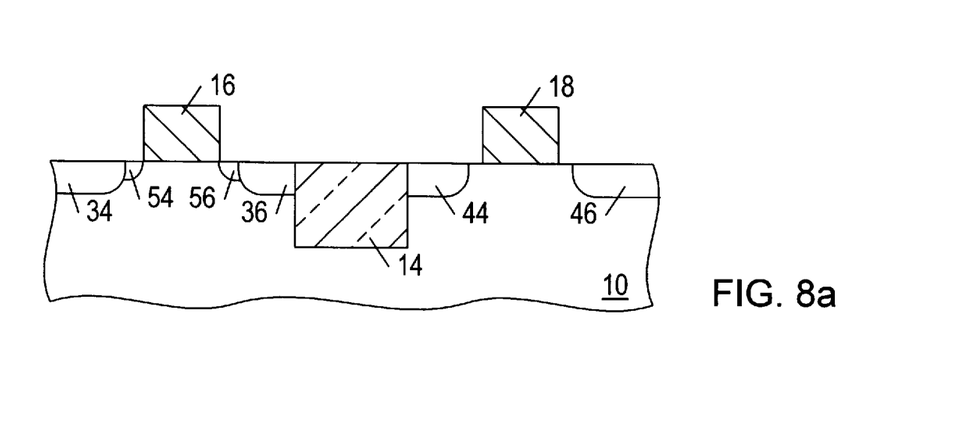
FIG. 8a is a partial cross-sectional view of a semiconductor topography according to a processing step subsequent to FIG. 7 in which the photoresist layer upon the second gate conductor is removed.

Turning now to FIG. 8a, a step subsequent to FIG. 7 is shown in which photoresist layer 50 is removed. FIG. 8a illustrates one embodiment absent of an anneal cycle.

Figure 8B:
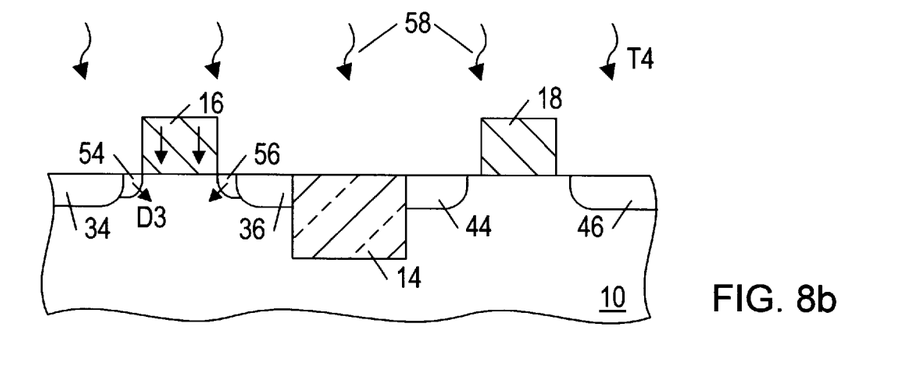
FIG. 8b is a partial cross-sectional view of a semiconductor topography according to a processing step subsequent to FIG. 7 in which the photoresist layer is removed and an optional thermal anneal at a fourth temperature less than the third temperature is performed.

Turning now to FIG. 8b, a step subsequent to FIG. 7 is shown in which photoresist layer 50 is removed and an optional thermal anneal is performed. Thermal anneal 58 may be performed to activate and position the third concentration of N$^-$ ions. The thermal anneal is performed at a fourth temperature $T_4$ which is less than third temperature $T_3$. Phosphorus, used as the n-type LDD implant, is a smaller ion with a higher diffusivity than, for example, the n-type source/drain implant arsenic and thus requires lower temperatures to migrate the same distance. The already implanted and activated arsenic ions are not affected much by the lower temperature thermal anneal because of their much lower diffusivity. Furthermore, a small additional migration of the already implanted P$^+$ dopants is not very important. The P$^+$ ions form the source/drain region which is a spaced distance from the channel area. Any horizontal migration will not affect the channel length and, therefore, will not contribute to harmful short-channel effects.

Figure 9:
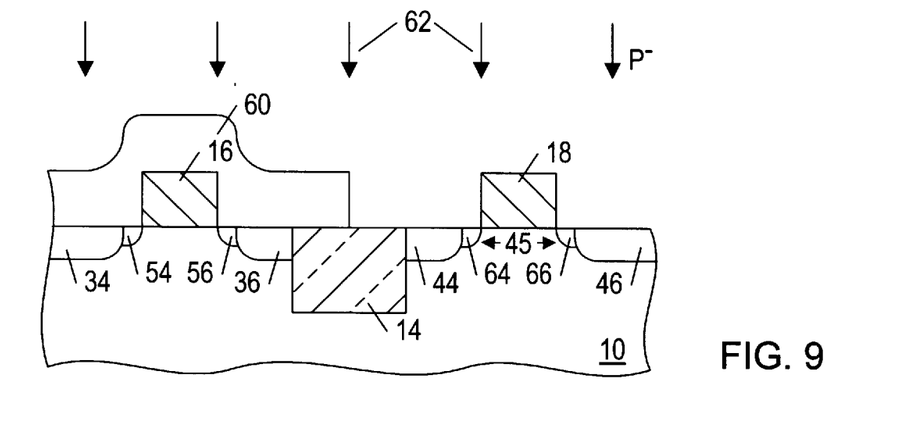
FIG. 9 is a partial cross-sectional view of a semiconductor topography according to a processing step subsequent to FIG. 8a or 8b in which a fourth p-type species (P− LDD) is implanted into the semiconductor topography substantially adjacent to the second channel area.

Turning now to FIG. 9, a step subsequent to FIG. 8b is shown in which photoresist layer 60 is deposited upon the semiconductor topography. Photoresist layer 60 is then patterned in such a way as to expose gate conductor 18 and part of upper surface 12 on opposing sides of gate conductor 18. Photoresist layer 60 is patterned using the same mask as photoresist layer 40 and the reverse of the mask used to form photoresist layer 30 and photoresist layer 50. A fourth concentration of p-type dopants 62 is then introduced into gate conductor 18 and LDD areas 64 and 66 substantially adjacent to channel area 45 due to the absence of spacers 26 and 28. P$^-$ dopants 62 preferably comprise boron ions introduced by a low-current implanter at a dose somewhere near $5 \times 10^{13}$ cm$^{-2}$ and at energies of 10–50 keV, for example.

Figure 10:
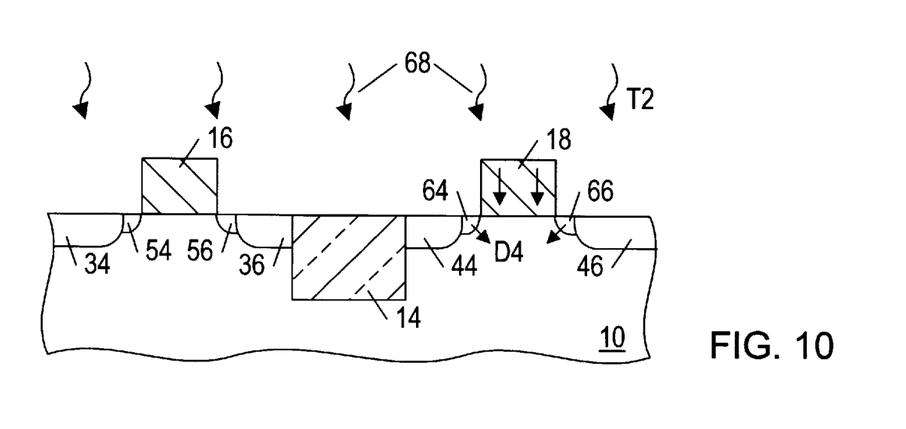
FIG. 10 is a partial cross-sectional view of a semiconductor topography according to a processing step subsequent to FIG. 9 in which a thermal anneal at a second temperature less than the first temperature is performed on the semiconductor topography.

Turning now to FIG. 10, a step subsequent to FIG. 9 is shown in which the wafer is thermally annealed. Thermal anneal 68 is performed in an RTA chamber. The wafers are preferably annealed for approximately 10–30 seconds at a temperature $T_2$ somewhere near 950° C. and less than optional anneal temperature $T_4$. A conventional oven would accomplish the same diffusion of the P⁻ implants with a larger amount of heat transferred to the substrate. Such a large amount of heat would also affect the pre-existing implants. An RTA chamber uses more directional energy sources and provides heat only to specific areas, minimizing the overall energy transferred to the substrate and conserving the thermal budget. Just enough heat should be provided to activate the P⁻ implants while affecting all the existing implants as little as possible. Excessive migration of the P–implants can be harmful to the device. The P⁻ LDD implants define the length of the channel of the device. Excessive migration can cause shortening of the channel which can give rise to many harmful short-channel effects. In addition, since the P⁻ implant typically comprises boron, providing just the required amount of heat is especially critical. Boron is a small ion with a very high diffusivity and requires minimum energy to be activated and diffuse into position. It is advantageous, therefore, not to have any subsequent high temperature anneal steps.

Figure 11:
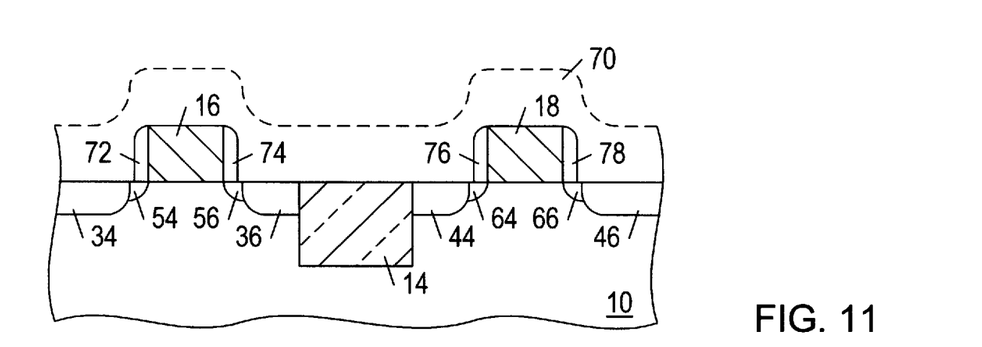
FIG. 11 is a partial cross-sectional view of a semiconductor topography according to a processing step subsequent to FIG. 10 in which spacers are formed on the opposed sidewall surfaces of the first and second gate conductors.

Turning now to FIG. 11, a step subsequent to FIG. 10 is shown in which conformal dielectric layer 70 is deposited upon the semiconductor topography. In a preferred embodiment, conformal dielectric layer 20 comprises decomposed TEOS at approximately 400° C. deposited by CVD. This produces a film with excellent conformatity. The dielectric layer is then etched using an anisotropic etch with a minimum overetch. An anisotropic etch removes the dielectric in the substantially horizontal regions while leaving spacers on the sidewall surfaces of gate conductors 16 and 18. Oxide spacers 72 and 74 are formed on the sidewalls of gate conductor 16, and oxide spacers 76 and 78 are formed on the sidewalls of gate conductor 18. It is important to reform the spacers on the sidewall surfaces of the gate conductors because of the subsequent silicide formation as shown in the following figure. Silicide layers are formed upon the source/drain regions and the gate conductors using a self aligned process. The silicide layers are formed only where there is exposed silicon. If the spacers are not reformed, silicide will form along the sidewall surfaces of gate conductors 16 and 18. An electrical short will then be established between the gate conductor and the source/drain regions adjacent them.

Figure 12:
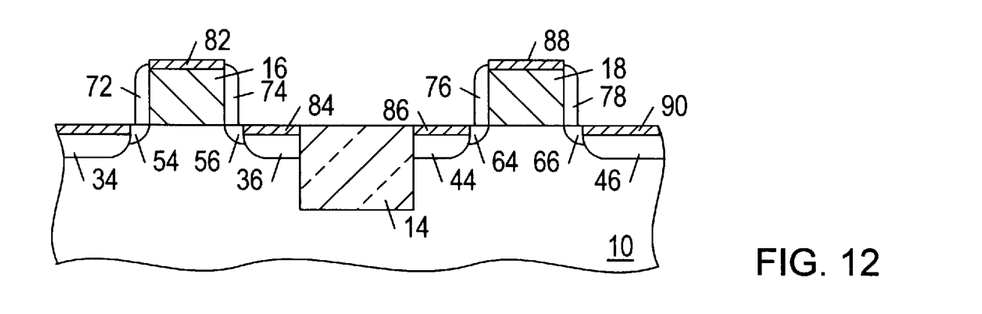
FIG. 12 is a partial cross-sectional view of a semiconductor topography according to a processing step subsequent to FIG. 11 in which silicide is formed upon exposed silicon-based first and second gate conductors and source/drain areas adjacent the first and second gate conductors.

Turning now to FIG. 12, a step subsequent to FIG. 11 is shown in which salicide layers 80, 82, 84, 86, 88, and 90 are formed upon gate conductors 16 and 18 and source/drain areas 34, 36, 44, and 46. A refractory metal such as titanium, platinum, cobalt, molybdenum, tantalum, or tungsten is deposited upon the semiconductor topography. Titanium is usually preferred because of its relatively low contact resistivity. The wafer is then heated (or annealed—possibly in two steps) which causes a silicide reaction at the silicon/metal interface. The metal only reacts wherever it is in contact with silicon and generally not anywhere else. The unreacted metal is then selectively removed through the use of an etchant that does not attack the silicide, the silicon, or the silicon oxide layers. As a result the exposed silicon is now completely covered with silicide, but the rest of the wafer is not. Due to the presence of the oxide spacers along the sidewall surfaces of the gate conductors no saticide is formed there.

It will be appreciated to those skilled in the art having the benefit of this disclosure that this invention is believed to be capable of forming an LDD structure using a reverse process flow such that higher temperature anneals are performed first to prevent migration of high diffusivity dopants. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming an integrated circuit, comprising:

providing a first active area laterally spaced from a second active area within a semiconductor substrate, wherein a first gate conductor having first opposed sidewall surfaces is arranged upon the first active area and a second gate conductor having second opposed sidewall surfaces is arranged upon the second active area;

forming a first pair of dielectric sidewall spacers upon the first opposed sidewall surfaces and a second pair of dielectric sidewall spacers upon the second opposed sidewall surfaces;

implanting n-type species of a first concentration into the first active area a first spaced distance from first opposed sidewall surfaces of the first gate conductor;

annealing the semiconductor substrate at a first temperature subsequent to said implanting n-type species of a first concentration;

implanting p-type species of a second concentration into the second active area a second spaced distance from second opposed sidewall surfaces of the second gate conductor subsequent to said annealing the semiconductor substrate at a first temperature;

removing the first and second pairs of dielectric sidewall spacers from respective said first and second gate conductors;

implanting p-type species of a third concentration less than the second concentration into the second active area immediately adjacent the second opposed sidewall surfaces subsequent to said implanting p-type species of a second concentration; and annealing the semiconductor substrate at a second temperature less than the first temperature subsequent to said implanting p-type species of a third concentration.

2. The method of claim 1, wherein the n-type species of the first concentration comprises arsenic.

3. The method of claim 1, wherein the p-type species of the second concentration and the p-type species of the third concentration comprise boron.

4. The method of claim 1, wherein the first gate conductor and the second gate conductor are patterned from a layer of polycrystalline silicon.

5. The method of claim 1, wherein said forming a first pair of dielectric sidewall spacers and a second pair of dielectric sidewall spacers comprises:

depositing a dielectric material across the first and second gate conductors; and anisotropically etching the dielectric material such that the dielectric material is removed from the first and second gate conductors except upon the first opposed sidewall surfaces and the second opposed sidewall surfaces.

6. The method of claim 1, further comprising implanting n-type species of a fourth concentration less than the first concentration into the first active area substantially adjacent the first opposed sidewall surfaces of the first gate conductor subsequent to said removing the first and second pairs of sidewall spacers and prior to said implanting p-type species of a third concentration.

7. The method of claim 6, further comprising annealing the semiconductor substrate at a third temperature less than the first temperature and greater than the second temperature subsequent to said implanting p-type species of a second concentration and prior to said implanting n-type species of a fourth concentration.

8. The method of claim 7, further comprising annealing the semiconductor substrate at a fourth temperature less than the third temperature and greater than the second temperature subsequent to said implanting n-type species of a fourth concentration and prior to implanting p-type species of a third concentration.

9. The method of claim 6, wherein the n-type species of the fourth concentration comprises phosphorus.

* * * * *